United States Patent [19]

Sempel

[11] Patent Number: 4,877,979
[45] Date of Patent: Oct. 31, 1989

[54] FILTER ARRANGEMENT

[75] Inventor: Adrianus Sempel, Eindhoven, Netherlands

[73] Assignee: U.S. Philips Corporation, New York, N.Y.

[21] Appl. No.: 126,380

[22] Filed: Nov. 30, 1987

[30] Foreign Application Priority Data

Dec. 11, 1986 [NL] Netherlands .......................... 8603152

[51] Int. Cl.⁴ .......................... H03K 5/00; H03F 1/36
[52] U.S. Cl. .................................... 307/520; 328/165; 328/167; 330/107; 330/294
[58] Field of Search ................. 307/520, 521; 328/165, 328/167; 330/107, 294; 333/172

[56] References Cited

U.S. PATENT DOCUMENTS

| 3,550,027 | 12/1970 | Uetrecht | 307/520 |
|---|---|---|---|
| 3,590,284 | 6/1971 | Yamane | 307/520 |
| 3,949,316 | 4/1976 | Tsurushima | 330/107 |
| 3,993,959 | 11/1976 | Boctor | 328/167 |
| 4,340,868 | 7/1982 | Pace | 330/294 |
| 4,424,462 | 1/1984 | Gay | 307/520 |
| 4,438,405 | 3/1984 | Yazawa et al. | 307/243 |
| 4,524,332 | 6/1985 | Gay | 330/107 |

OTHER PUBLICATIONS

Tietze et al, Book Title "Halbleiter Schaltungstechnik", Section 13.4.3, pp. 295–297, 5th edition, 1980.

Primary Examiner—Stanley D. Miller
Assistant Examiner—Huy Kim Mai
Attorney, Agent, or Firm—Bernard Franzblau

[57] ABSTRACT

A fitter comprising a first ($R_1$) and a second ($R_2$) resistor arranged in series between an input terminal (5) for receiving an input voltage ($v_i$) and the input (2) of an amplifier. The amplifier (1) comprises a transistor ($T_1$) whose base is coupled to the input (2), whose emitter is coupled to a first output (3) and via a current source ($I_1$) to ground, and whose collector is coupled to a second output (4) and via a third resistor ($R_3$) to the positive power-supply terminal. A first capacitor ($C_1$) is arranged between the junction point (6) between the first resistor ($R_1$) and the second resistor ($R_2$) and the first output and a second capacitor ($C_2$) is arranged between the input (2) and ground. A signal having a second-order low-pass characteristic is taken from the first output and a signal having a second-order high-pass characteristic is taken from the second output.

13 Claims, 2 Drawing Sheets

FILTER ARRANGEMENT

SUMMARY OF THE INVENTION

This invention relates to a filter arrangement comprising at least a first and a second resistor arranged in series between an input terminal for receiving an input signal and an input of an amplifier comprising a transistor whose base is coupled to the input and whose emitter is coupled to a first power-supply terminal by means of a current source and to a first output for delivering a first output signal. The first output is coupled to the junction point between the first resistor and the second resistor via a first capacitor and the amplifier input is coupled to a power-supply terminal via a second capacitor.

Such a filter arrangement is suitable for general purpose and in particular for use in a fully integrated television receiver.

Such a filter arrangement is known, inter alia, from the book "Halbleiter Schaltungstechnik" by Tietze and Schenk, 5th edition, 1980, pp. 295–296. This filter arrangement is generally referred to as a Sallen-Key filter and constitutes a second-order low-pass filter arrangement in which the output signal is taken from the emitter of the transistor. The collector of this transistor is connected directly to the positive power-supply terminal.

In addition to a low-frequency signal with a second-order low-pass characteristic, many applications also require a high-frequency signal with a second-order high-pass characteristic. For this purpose a separate second-order high-pass filter may be employed, but this results in the number of components being doubled and an increase in power consumption.

European Patent Specification No. 52.117 (which corresponds to U.S. Pat. No. 4,340,868) describes a filter arrangement comprising a first transistor whose collector is connected to a reference voltage via a capacitor and to the emitter of a second transistor whose base is also connected to said reference voltage and whose collector is connected to a bias current source and to a second capacitor and the base of the first transistor.

A table indicates whether the voltages and currents at various points in this filter arrangement have a low-pass, a high-pass or a band-pass characteristic for each of the possible inputs to which an input signal can be applied. This table indicates that in two cases both a signal with a high-pass characteristic and a signal with a low-pass characteristic are obtained. If an input voltage is applied to the emitter of the first transistor, the table shows that a voltage having a second-order low-pass characteristic appears on the base of this transistor and the collector current of the first transistor constitutes a second-order high-pass signal current. However, as is indicated in the description of said Patent Specification, this signal current is not available for further use. Thus, when the emitter is driven this does not yield both a signal having a low-pass characteristic and a signal having a high-pass characteristic. If an input voltage is applied to the base of the second transistor said table indicates that a voltage having a second-order low-pass characteristic is obtained on the emitter of the second transistor and the collector current of the second transistor constitutes a signal current having a second-order high-pass characteristic. However, to enable this signal current to be utilised additional means are required, for example a diode in the collector line of the second transistor arranged in parallel with a further transistor. The arrangement then comprises a comparatively large number of components.

SUMMARY OF THE INVENTION

Therefore, it is an object of the invention to provide a filter arrangement comprising a minimal number of components which provides both an output signal having a second-order low-pass characteristic and an output signal having a second-order high-pass characteristic. According to the invention a filter arrangement as defined in the opening paragraph is characterized in that the collector of the transistor is coupled to a second output for a second output signal. The invention is based on the recognition of the fact that the current through the first capacitor has a second-order high-pass characteristic. This current is applied to the emitter of the transistor so that almost the full current also flows into the collector of this transistor. The collector current is now used in order to generate a second output signal. The filter arrangement comprises only one transistor so that it is constructed with a minimal number of components and can be integrated on a very small chip area. Moreover, the filter arrangement requires only a very low supply voltage and has a low current consumption.

A first embodiment of a filter arrangement in accordance with the invention may be characterized in that the collector is coupled to a second power-supply terminal via a third resistor. The signal voltage available across the third resistor then constitutes the output signal having a second-order high-pass characteristic.

A second embodiment of a filter arrangement in accordance with the invention may be characterized in that the amplifier circuit comprises a second transistor having its base coupled to the base of the first transistor, having its emitter coupled to the first power-supply terminal by means of a second current source identical to the first current source, and having its collector coupled to the second power-supply terminal via a fourth resistor identical to the third resistor and to a third output. The second output signal is available between the second output and the third output. As a result of these steps, undesired voltage components in the output voltage as a result of supply-voltage variations and bias-current variations are largely suppressed. This greatly improves the rejection of the signal voltage in the so-called stop band.

A third embodiment of a filter arrangement in accordance with the invention may be characterized in that the collector of the transistor is coupled to a second power-supply terminal by means of a second current source which is substantially identical to the first current source. The second current source compensates for the current from the first current source so that the signal current flowing through the first capacitor can be taken directly from the second output.

A fourth embodiment of a filter arrangement in accordance with the invention may be characterized in that the second capacitor is coupled to a power-supply terminal by a fifth resistor and to an output for a third output signal. The current through the second capacitor has a first-order band-pass characteristic. This current is utilized by arranging a resistor in series with the second capacitor, across which resistor an output voltage having a first-order band-pass characteristic is available.

BRIEF DESCRIPTION OF THE DRAWINGS

Embodiments of the invention will now be described in more detail, by way of example, with reference to the accompanying drawings, in which.

DESCRIPTION OF THE PREFERRED EMBODIMENTS

Figure 1:
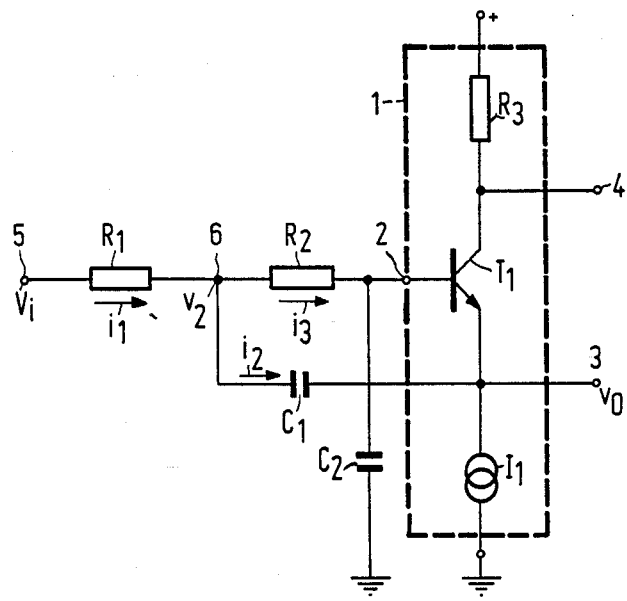
FIG. 1 shows a first embodiment of a filter arrangement in accordance with the invention.

FIG. 1 shows the simplest embodiment of a filter arrangement in accordance with the invention. The arrangement comprises an amplifier 1 which in the present embodiment comprises a transistor $T_1$ whose base is coupled to the input 2 of the amplifier, whose emitter is coupled to a first output 3 and via current source $I_1$ to the negative power-supply terminal, in the present case ground, and whose collector is coupled to a second output 4 and via a resistor $R_3$ to the positive power-supply terminal. A bidirectional current path between an input terminal 5 and the amplifier input 2 includes the series arrangement of two resistors $R_1$ and $R_2$ connected between the signal input 5 and the input 2 of the amplifier 1. The junction point 6 between these resistors is connected to the first output 3 by a first capacitor $C_1$. The input 2 of the amplifier 1 is coupled to the negative power-supply terminal via a bidirectional current path that includes a capacitor $C_2$. It is to be noted that this capacitor may alternatively be coupled to the positive power-supply terminal.

The arrangement without the resistor $R_3$ and the output 4, in which the collector of the transistor $T_1$ is connected directly to the positive power-supply terminal, is a second-order low-pass filter arrangement known per se, in which the output signal is taken from the emitter of the transistor $T_1$. In brief, this known arrangement operates as follows. For low frequencies the reactance of the capacitors $C_1$ and $C_2$ is so large that these capacitors do not affect the operation of the arrangement. The signal voltage at the output 3 is then substantially equal to that at the input 5. At increasing frequency the reactance of the capacitors $C_1$ and $C_2$ decreases. Under the influence of the capacitor $C_2$ the arrangement then behaves as a first-order RC filter, the signal voltage on the output 3 having a roll-off of 6 dB/octave. At increasing frequency the signal voltage on the output 3 becomes so small that this output may be regarded as a virtual ground. As a result of this, the capacitor $C_1$ is connected to ground. The circuit then behaves as a second-order RC filter, the signal voltage on the output 3 having a roll-off of substantially 12 dB/octave.

The transfer function to the output 3 of the circuit arrangement can be derived as follows. If for an input voltage $v_i$ and an output voltage $v_o$ the current through the resistor $R_1$ is $i_1$, the current through the capacitor $C_1$ is $i_2$, and the current through the resistor $R_2$ is $i_3$, the following equation is valid:

$$i_1 = i_2 + i_3 \quad (1)$$

If the voltage at the junction point 6 between the resistors $R_1$ and $R_2$ is $v_1$ and it is also assumed that the voltage on the input 2 is $v_o$, equation 1 may be written as $$\frac{v_i - v_1}{R_1} = (v_1 - v_0)pC_1 + \frac{(v_1 - v_0)}{R_2} \quad (2)$$

where p is the complex frequency. If the base current of the transistor $T_1$ is ignored, the current $i_3$ flows fully through the capacitor $C_2$, so that $$\frac{v_1 - v_0}{R_2} = v_0 pC_2 \text{ or } v_1 = (pC_2R_2 + 1)v_0 \quad (3)$$

Inserted in equation 2, it follows that the transfer function is $$\frac{v_0}{v_i} = \frac{1}{p^2 T_1 T_2 + p(T_2 + R_1 C_2) + 1} = \frac{1}{N} \quad (4)$$

where $T_1 = R_1 C_1$ and $T_2 = R_2 C_2$. Equation (4) is characteristic of the transfer function of a second-order low-pass filter arrangement.

The current through the capacitor $C_1$ complies with:

$$i_2 = (v_1 - v_0)pC_1 = p^2 C_1 T_2 V_o \quad (5)$$

This current and the input voltage are related as follows:

$$\frac{i_2}{v_i} = \frac{p^2 C_1 T_2}{N} \quad (6)$$

This equation is characteristic of the transfer function of a second-order high-pass filter arrangement. The invention is based on the recognition of the fact that the current $i_2$ is a signal having a second-order high-pass characteristic. In accordance with the invention this current is utilized to derive a second-order high-pass-filtered output signal in addition to a second-order low-pass-filtered output signal by means of the same filter arrangement. The current $i_2$ is injected at the emitter of the transistor $T_1$ and also flows into the collector of this transistor, when the base current is ignored. In this embodiment the collector is coupled to the positive power-supply terminal via a resistor $R_3$. A signal voltage appears across this resistor which is given by $$\frac{v_0'}{v_i} = \frac{p^2 C_1 T_2 R_3}{N} \quad (7)$$

The voltage $v_o'$ is available on the output 4.

Figure 2:
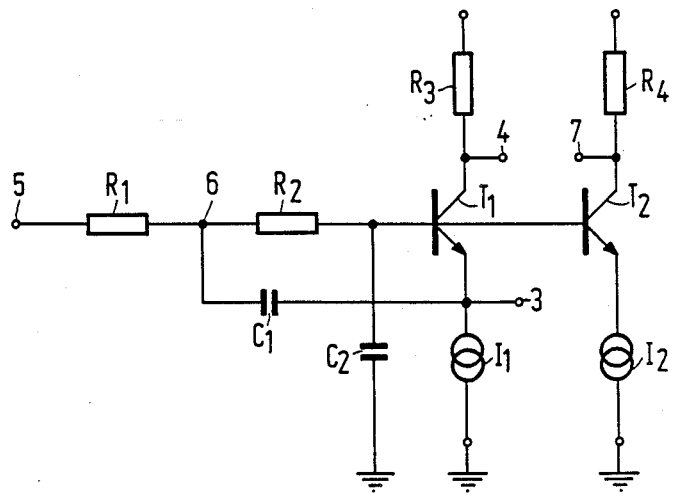
FIG. 2 shows a second embodiment of a filter arrangement in accordance with the invention.

FIG. 2 shows a second embodiment of a filter arrangement in accordance with the invention in which identical parts bear the same reference numerals as in FIG. 1. A transistor $T_2$ is arranged in parallel with the transistor $T_1$ and has its emitter coupled to ground via a current source $I_2$ identical to the current source $I_1$. The collector of $T_2$ coupled to the positive power-supply terminal via a resistor $R_4$ identical to the resistor $R_3$. The collector of the transistor $T_2$ is also coupled to an output 7. The output voltage is now differentially taken from the outputs 4 and 7. This has the following advantage. Supply-voltage variations give rise to variations in the current through the transistor $T_1$ owing to retroaction. Since the current source $I_1$ has a finite output impedance, low-frequency voltage variations on the emitter of the transistor $T_2$ also give rise to variations in the current through the transistor $T_1$. These two current variations produce undersired voltages on the output 4, as a result of which the suppression of supply voltage variations and the stop-band rejection at the output 4 are comparatively small. The undesired voltages appearing on the collector of the transistor $T_1$ also appear on the collector of the transistor $T_2$. These undesired voltages are suppressed strongly by differential take-off of the high-pass filtered signal.

Figure 3:
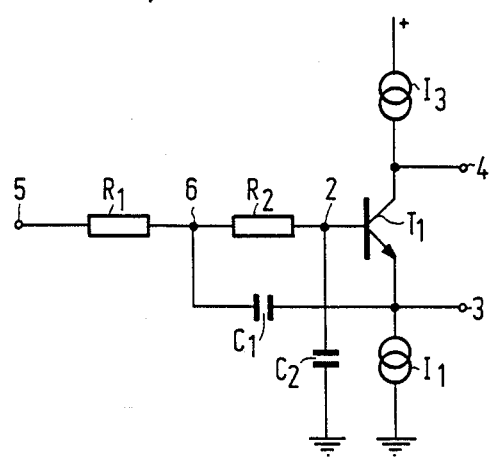
FIG. 3 shows a third embodiment of a filter arrangement in accordance with the invention.

FIG. 3 shows a third embodiment of a filter arrangement in accordance with the invention, in which identical parts bear the same reference numerals as in FIG. 1. In this embodiment the collector of the transistor $T_1$ is not coupled to the positive power-supply terminal via a resistor, but via a current source $I_3$. The current source $I_3$ compensates for the current from the current source $I_1$. The signal current $i_2$ (see equation 6) is then available directly at the output 4.

Figure 4:
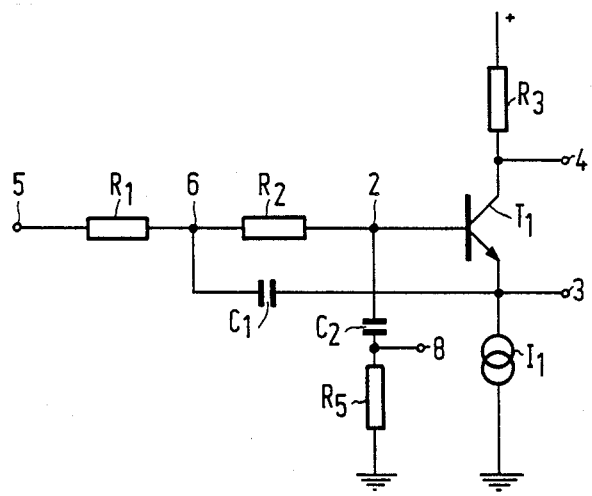
FIG. 4 shows a fourth embodiment of a filter arrangement in accordance with the invention.

FIG. 4 shows a fourth embodiment of a filter arrangement in accordance with the invention, in which identical parts bear the same reference numerals as in FIG. 1. This embodiment differs from that shown in FIG. 1 in that a resistor $R_5$ is arranged in series with the capacitor $C_2$. The current through the capacitor $C_2$ complies with:

$$i_3 = v_o p C_2 \tag{8}$$

so that the following relationship exists between this current and the input voltage:

$$\frac{i_3}{v_i} = \frac{pC_2}{N} \tag{9}$$

This equation is characteristic of the transfer function of a first-order band-pass filter arrangement. The current $i_3$ is now converted into a voltage across the resistor $R_5$, which voltage can be taken from the output 8. This voltage is then equal to:

$$\frac{v_o'}{v_i} = \frac{pR_5C_2}{N} \tag{10}$$

It is to be noted that is the capacitor $C_2$ if connected to the positive power-supply terminal, the resistor $R_5$ is also connected to the positive power-supply terminal.

The invention is not limited to the embodiments shown. Within the scope of the invention many variants are conceivable to those skilled in the art. For example, in the embodiments shown the amplifier comprises only one transistor. However, the amplifier may alternatively comprise a Darlington transistor. Further, in the embodiment shown in FIG. 1 the high-frequency signal is available on the output 4 relative to the positive supply voltage. However, it is alternatively possible to first process the collector current of the transistor $T_1$ in a current-mirror circuit, after which it is converted into a voltage across the resistor $R_3$, so that at the output 4 the signal is available relative to ground.

What is claimed is:

1. A filter arrangement comprising at least a first and a second resistor connected in series between an input terminal for receiving an input signal and an input of an amplifier circuit comprising a transistor having a base coupled to the input and an emitter coupled to a first power-supply terminal by means of a current source and to a first output for providing a first output signal, means for coupling said first output to a junction point between the first resistor and the second resistor via a first capacitor, second means including a second capacitor for coupling the amplifier circuit input to a power-supply terminal, and third means coupling the collector of the transistor to a second output for providing a second output signal and to a second power supply terminal via a third resistor.

2. A filter arrangement as claimed in claim 1, wherein the amplifier circuit comprises a second transistor having its base coupled to the base of the first transistor, having its emitter coupled to the first power-supply terminal by means of a second current source identical to the first current source, and having its collector coupled to the second power-supply terminal via a fourth resistor identical to the third resistor and to a third output, wherein the second output signal is provided between the second output and the third output.

3. A filter arrangement as claimed in claim 2, wherein the second capacitor is coupled to the power-supply terminal via a fifth resistor and to a fourth output for providing a third output signal.

4. A filter arrangement as claimed in claim 1 wherein the second coupling means provides a bidirectional current path, including the second capacitor, between the base of the transistor and said power supply terminal.

5. A filter arrangement as claimed in claim 1 wherein said first and second series connected resistors are part of a bidirectional current path between said input terminal and said amplifier circuit input.

6. A dual output filter comprising: an input terminal for receiving an input signal, a transistor amplifier having a base, collector and emitter, first and second resistors connected in series circuit between the input terminal and said base of the transistor, means coupling the emitter of the transistor to a first power supply terminal via a current source, means coupling a first output terminal to the emitter of the transistor and via a first capacitor to a junction point between the first and second resistors, means including a third resistor for coupling the collector of the transistor to a second power supply terminal, a second capacitor coupling the transistor base to one of said power supply terminals, and a second output terminal coupled to the collector of the transistor whereby the filter provides first and second output signals at said first and second output terminals, respectively, said first and second signals having a second order low-pass characteristic and a second order high-pass characteristic, respectively.

7. A filter as claimed in claim 6 wherein the second capacitor is coupled to said one power supply terminal via a fourth resistor, and a third output terminal coupled to the fourth resistor to provide a third output signal having a first order bandpass characteristic.

8. A filter arrangement comprising at least a first and a second resistor connected in series between an input terminal for receiving an input signal and an input of an amplifier circuit comprising a transistor having a base coupled to the input and an emitter coupled to a first power-supply terminal by means of a current source and to a first output for providing a first output signal, means for coupling said first output to a junction point between the first resistor and the second resistor via a first capacitor, second means including a second capacitor for coupling the amplifier circuit input to a power-supply terminal, and third means coupling the collector of the transistor to a second output for providing a second output signal and to a second power-supply terminal via a second current source substantially identical to the first current source.

9. A filter arrangement comprising at least a first and a second resistor connected in series between an input terminal for receiving an input signal and an input of an amplifier comprising a transistor having a base coupled to the input and an emitter coupled to a first power-supply terminal by means of a current source and to a first output providing a first output signal, first means for coupling said first output to a junction point between the first resistor and the second resistor via a first capacitor, second means including a second capacitor and a third resistor for coupling the amplifier input to a power-supply terminal, and a second output for providing a second output signal and coupled to a circuit point between the second capacitor and the third resistor.

10. A filter arrangement as claimed in claim 9 further comprising third means coupling the collector of the transistor to a third output providing a third output for signal.

11. A filter arrangement as claimed in claim 10 wherein the collector of said transistor is coupled to a second power-supply terminal via a fourth resistor.

12. A filter arrangement as claimed in claim 10 wherein the collector of said transistor is coupled to a second power-supply terminal by means of a second current source substantially identical to the first current source.

13. A dual output filter comprising: an input terminal for receiving an input signal, a transistor amplifier having a base, collector and emitter, first and second resistors connected in series circuit between the input terminal and said base of the transistor, means coupling the emitter of the transistor to a first power supply terminal via a current source, means coupling a first output terminal to the emitter of the transistor and via a first capacitor to a junction point between the first and second resistors, means including a second current source for coupling the collector of the transistor to a second power supply terminal, a second capacitor coupling the transistor base to one of said power supply terminals, and a second output terminal coupled to the collector of the transistor whereby the filter provides first and second output signals at said first and second output terminals, respectively, said first and second signals having a second order low-pass characteristic and a second order high-pass characteristic, respectively.

* * * * *